(12) United States Patent
Kumar et al.

(10) Patent No.: US 10,015,486 B2
(45) Date of Patent: Jul. 3, 2018

(54) ENHANCED VIDEO DECODING WITH APPLICATION LAYER FORWARD ERROR CORRECTION

(71) Applicant: Intel Corporation, Santa Clara, CA (US)

(72) Inventors: Utsaw Kumar, Sunnyvale, CA (US); Ozgur Oyman, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 498 days.

(21) Appl. No.: 14/032,719

(22) Filed: Sep. 20, 2013

(65) Prior Publication Data

US 2014/0119459 A1    May 1, 2014

Related U.S. Application Data

(60) Provisional application No. 61/719,241, filed on Oct. 26, 2012.

(51) Int. Cl.
*H04N 19/93* (2014.01)
*H04N 19/89* (2014.01)
(Continued)

(52) U.S. Cl.
CPC ....... *H04N 19/00933* (2013.01); *H04N 19/89* (2014.11); *H03M 13/1505* (2013.01);
(Continued)

(58) Field of Classification Search
CPC ........... H04N 19/00933; H04N 21/631; H04N 1/00002; H04N 1/00005; H04N 1/00021;
(Continued)

(56) References Cited

U.S. PATENT DOCUMENTS

| 4,637,012 A | 1/1987 | Crabbe, Jr. |
| 4,637,021 A * | 1/1987 | Shenton ............... H03M 13/15 |
| | | 714/756 |

(Continued)

FOREIGN PATENT DOCUMENTS

| CN | 1526220 A | 9/2004 |
| CN | 101802797 A | 8/2010 |

(Continued)

OTHER PUBLICATIONS

"International Application Serial No. PCT/US2013/062417, International Search Report dated Jan. 16, 2014", 3 pgs.

(Continued)

*Primary Examiner* — Jay Patel
*Assistant Examiner* — Marnie Matt
(74) *Attorney, Agent, or Firm* — Schwegman Lundberg & Woessner, P.A.

(57) ABSTRACT

Devices and methods for video decoding with application layer forward error correction in a wireless device are generally described herein. In some methods a partial source symbol block is received that includes at least one encoded source symbol representing an original video frame. In such methods, the at least one encoded source symbol is systematic, the source symbol is decoded to recover a video frame, and the video frame is provided to a video decoder that generates a portion of an original video signal from the recovered video frame.

20 Claims, 6 Drawing Sheets

(51) Int. Cl.
*H03M 13/15* (2006.01)
*H03M 13/19* (2006.01)

(52) U.S. Cl.
CPC ........ *H03M 13/1515* (2013.01); *H03M 13/19* (2013.01); *Y02D 70/12* (2018.01); *Y02D 70/122* (2018.01)

(58) Field of Classification Search
CPC ........ H04N 1/32689; H04N 21/440227; G06F 11/10
See application file for complete search history.

(56) References Cited

U.S. PATENT DOCUMENTS

| | | | | |
|---|---|---|---|---|
| 5,577,191 | A * | 11/1996 | Bonomi | G11B 27/034 345/502 |
| RE43,741 | E * | 10/2012 | Shokrollahi | H03M 13/1102 341/50 |
| 2002/0181594 | A1* | 12/2002 | Katsavounidis | H03M 7/30 375/240.24 |
| 2003/0026343 | A1* | 2/2003 | Kim | H03M 7/30 375/240.27 |
| 2004/0114576 | A1* | 6/2004 | Itoh | H04L 1/0009 370/352 |
| 2005/0180459 | A1* | 8/2005 | Watson | H03M 13/1111 370/468 |
| 2006/0168504 | A1* | 7/2006 | Meyer | H04L 1/0026 714/799 |
| 2006/0282737 | A1* | 12/2006 | Shi | H03M 13/2966 714/746 |
| 2007/0195894 | A1* | 8/2007 | Shokrollahi | H04L 1/0041 375/242 |
| 2008/0022340 | A1* | 1/2008 | Hannuksela | H04N 7/17318 725/112 |
| 2008/0049845 | A1* | 2/2008 | Liu | H04N 19/176 375/240.27 |
| 2009/0067551 | A1* | 3/2009 | Chen | H04L 1/004 375/340 |
| 2009/0080510 | A1* | 3/2009 | Wiegand | H03M 13/03 375/240.01 |
| 2009/0158114 | A1* | 6/2009 | Shokrollahi | H03M 13/3761 714/752 |
| 2009/0168680 | A1* | 7/2009 | Singh | H04L 12/185 370/312 |
| 2009/0327842 | A1* | 12/2009 | Liu | H04L 1/0057 714/776 |
| 2010/0100791 | A1* | 4/2010 | Abu-Surra | H03M 13/118 714/752 |
| 2010/0103001 | A1* | 4/2010 | Shokrollahi | H03M 13/1191 341/94 |
| 2010/0223533 | A1* | 9/2010 | Stockhammer | H03M 13/373 714/776 |
| 2010/0263007 | A1 | 10/2010 | Zhang et al. | |
| 2011/0141362 | A1* | 6/2011 | Soundararajan | H04N 5/44504 348/564 |
| 2011/0188766 | A1* | 8/2011 | Nassor | H04N 7/327 382/233 |
| 2011/0191448 | A1* | 8/2011 | Rusert | H04N 7/163 709/219 |
| 2011/0216841 | A1* | 9/2011 | Luby | H03M 13/27 375/260 |
| 2011/0219279 | A1* | 9/2011 | Abu-Surra | H03M 13/2707 714/746 |
| 2012/0151302 | A1 | 6/2012 | Luby et al. | |
| 2012/0210190 | A1* | 8/2012 | Luby | H03M 13/3761 714/755 |

FOREIGN PATENT DOCUMENTS

| | | |
|---|---|---|
| CN | 101911737 A | 12/2010 |
| CN | 102334295 A | 1/2012 |
| KR | 1020120023127 A | 3/2012 |
| KR | 1020120105875 A | 9/2012 |

OTHER PUBLICATIONS

"International Application Serial No. PCT/US2013/062417, Written Opinion dated Jan. 16, 2014", 4 pgs.
"European Application Serial No. 13848750.9, Response filed Nov. 14, 2016 to Extended European Search Report dated Apr. 14, 2016", 13 pgs.
"Chinese Application Serial No. 201380050397.9, Office Action dated Jun. 2, 2017", without English Translation, 12 pgs.
"Chinese Application Serial No. 201380050397.9, Response filed Oct. 17, 2017 to Office Action dated Jun. 2, 2017", w/ English Claims, 19 pgs.

* cited by examiner

ENHANCED VIDEO DECODING WITH APPLICATION LAYER FORWARD ERROR CORRECTION

RELATED APPLICATION

This application claims the benefit of priority under 35 U.S.C. 119(e) to U.S. Provisional Patent Application Ser. No. 61/719,241, filed Oct. 26, 2012, which is incorporated herein by reference.

TECHNICAL FIELD

Embodiments pertain to wireless video streaming. Some embodiments relate to video streaming with application layer forward error correction.

BACKGROUND

Video communication over a wireless link may be challenging due to the relatively large bandwidth typically needed and the low-latency and high reliability constraints of video. The growth of multimedia applications and increased mobile Internet access has created a need for enhancing video delivery in wireless systems. For example, mobile users now expect to receive live sporting events, news updates, movie streaming, and other types of on-demand video on their wireless mobile devices. Wireless video standards have been created to help meet this demand. For example, evolved multimedia broadcast and multicast services (eMBMS) is one such standard.

Unfortunately, wireless channels tend to be lossy due to multipath signals, lost data, and corrupted data. Unicast transmissions can employ automatic repeat request (ARQ) and/or hybrid ARQ (HARQ) to increase the reliability of the transmission. However, for multicast transmissions, implementing ARQ and/or HARQ may lead to network congestion when multiple users request retransmission of different packets. Moreover, each user may have a different channel to the base station so that different users may lose different packets. Thus, transmission could mean sending a large portion of the original content again, leading to inefficient use of bandwidth as well as increased latency for some users.

Thus there are general needs for improved video transmission methods. There are also general needs for making efficient use of wireless bandwidth.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
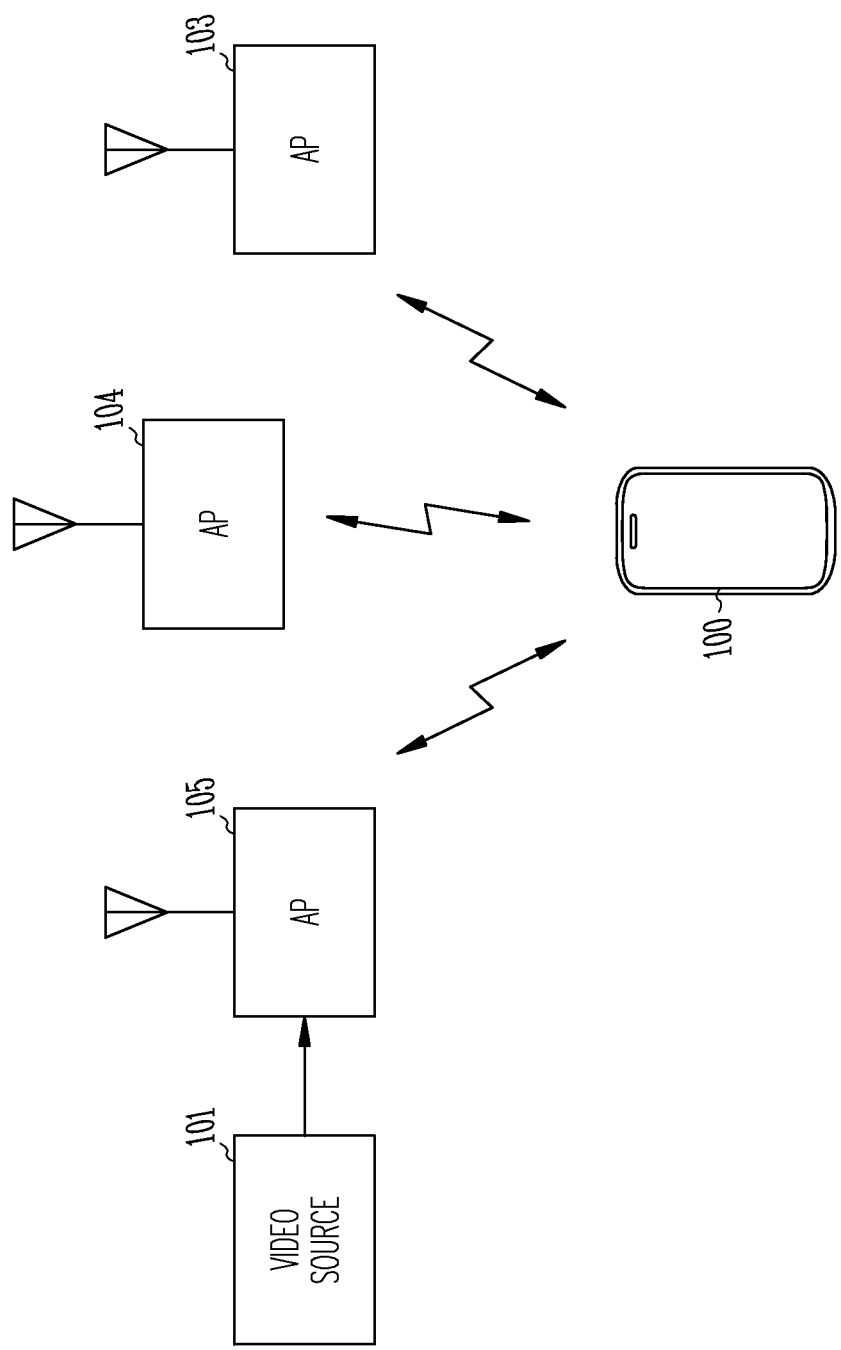
FIG. 1 illustrates a block diagram of an embodiment of a wireless network configured for video streaming.

FIG. 1 illustrates a block diagram of an embodiment of a wireless network that may transmit a wireless video signal. The network may include a wireless device 100 that may receive signals from access points 103-105 over a wireless link.

The wireless device 100 may be a mobile device or a non-mobile device. For example, the wireless device 100 may be a smartphone, a tablet computer, a laptop computer, or a desktop computer.

The access points 103-105 may be base stations that enable the wireless device 100 to access another network. For example, the access points 103-105 may be cellular base stations that may be coupled to the Internet and/or a communication network (e.g., public switched telephone network (PSTN)) through switching centers (not shown). Such a network might enable a smartphone to access the Internet and/or the PSTN over the wireless link. The access points 103-105 might also be WiFi transceivers that enable a wireless device 100 to access the Internet within a building.

In an embodiment, the access points 103-105 may be configured to transmit a live video signal from a video source 101. The video source 101 might include a video camera that is coupled to circuitry used to compress and encode a video signal for transmission to an access point 105 and subsequent transmission by the access point 105.

The video source 101 may encode the video signal for transmission using one or more of different video transmission protocols. For example, these protocols may include Motion Picture Experts Group (MPEG) protocols such as MPEG-1/2/4, H.261, H.264, and/or the Multimedia Broadcast Multicast Service (MBMS) point-to-multipoint interface specification. These protocols may provide compression and error correction data to video data symbols prior to transmission, as discussed subsequently with reference to FIG. 2.

The video source 101 might be coupled to the access point 105 over a wired or wireless link. One or more of the access points 103-105 may transmit the encoded and compressed video signal to one or more wireless devices 100 over the wireless link. The wireless device 100 may then receive the encoded, live video stream from an access point 105 with which it is associated, decode the video signal, and display the resulting decoded video frames on a display on the wireless device 100. Decoding of the received video signal is discussed subsequently with reference to FIGS. 4 and 5.

Live video delivery by video streaming over a wireless link may be different than video delivery by file download. Streaming live video may include different and more difficult challenges as compared to delivery of a file comprising video symbols. For example, in video streaming, the video decoder may need to decode the received video symbols in real time and typically may not have time to request a retransmission of symbols lost due to errors, dropped symbols, or other problems. Thus, a typical receiver in present use may simply drop blocks of video symbols that cannot be decoded due to errors encountered in its transmission. This may result in poor video quality for a user.

Figure 2:
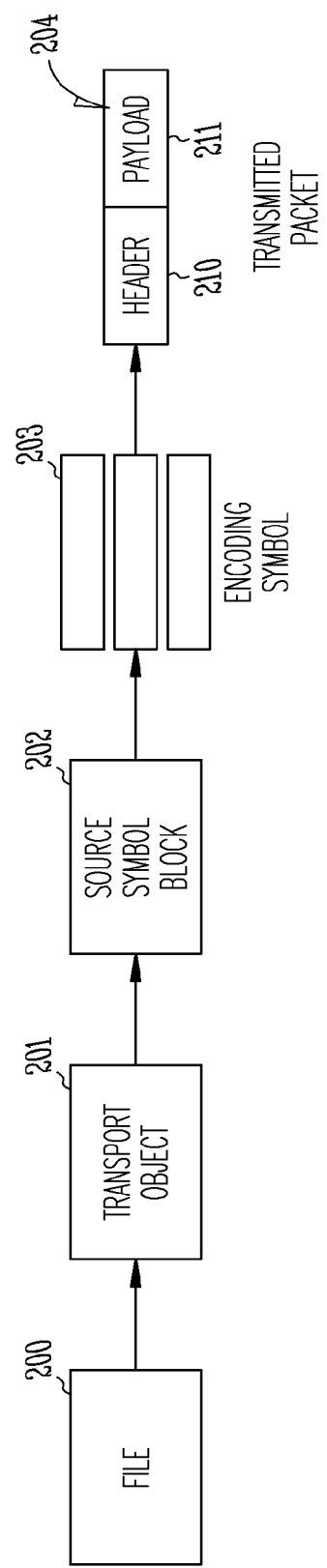
FIG. 2 illustrates a block diagram of an embodiment of an encoding method of a source symbol block of video frames for transmission in accordance with the wireless network of FIG. 1.

FIG. 2 illustrates a block diagram of an embodiment of an encoding method of a source symbol block of video frames for transmission in accordance with the wireless network of FIG. 1. Such a method might be used by the video source 101 prior to transmission over a wireless link in order to compress the video data to a smaller size to reduce bandwidth requirements as well as to encode the video data with forward error correction code. The error correction codes might enable a receiving device to correct some errors that might occur over the wireless link.

The choice of the parameters (e.g., source symbol size, encoding rate) used for the application layer forward error correction (AL-FEC) might be made by the Broadcast Multicast Service Center (BMSC). In an embodiment, the BMSC may be located in the video source 101 of FIG. 1. The BMSC may select a number of source symbols designated as K, the encoding rate designated as K/N (where N is a time period), and the source symbol size designated as T.

A larger value of K is desirable due to increased efficiency and performance of the AL-FEC scheme. However, the larger the value of K, the higher the latency for a fixed symbol size T since there may be a need to wait for a longer time for a sufficient number of frames to be received prior to performing the encoding. The encoding rate choice also may affect the end-to-end performance since, the smaller the value of K/N, the larger the redundancy that may be added to the source symbols as more repair symbols are generated. Thus, the smaller the value of K/N, the better the system performance.

Evolved MBMS (eMBMS)-based live video streaming may be accomplished using a transport protocol. An example of such a protocol may be File Delivery over Unidirectional Transport (FLUTE). This protocol may enable reduced error transmission of files (e.g., groups of packets) via unidirectional MBMS-bearers. Live video streaming may have more strict time constraints for content delivery. FIG. 2 illustrates one such encoding method.

The file 200 may be a grouping of packets of data as generated by a video camera during recording of a video program. The file 200 of packets may be parsed to form transport objects 201. The transport objects 201 may be formed by a regrouping of the packets of data, from a video format in which the packets were generated, to a data object that may be grouped to form a source symbol block 202. The transport objects 201 may be grouped into K source symbols to form the source symbol block 202.

The encoding symbols 203 may be generated by encoding the symbols in the source symbol block 202 with a specific FEC encoding scheme (e.g., Hamming, Reed-Solomon, Golay). FEC may be accomplished by adding redundancy to the transmitted information. A redundant bit may be a complex function of many original information bits. The original information may or may not appear literally in the encoded output. Codes that include the unmodified input data in the output data may be referred to as systematic. Codes that do not include the unmodified input data in the encoded output data may be referred to as non-systematic.

Each of the encoding symbols 203 may now be used to form transmitted packets (e.g., FLUTE packets) with appropriate headers 210 and payloads 211 (i.e., encoded video data). In an embodiment, an Internet Protocol version 4 (IPv4)/User Datagram Protocol (UDP)/FLUTE header 210 may be a total of 44 bytes per IP packet where the IP packet might have a total of 1333 bytes. Thus, a maximum FLUTE payload size might be 1333−44=1289 bytes. This FLUTE payload 211 and header 210 description is for purposes of illustration only as other embodiments might have different sizes. The transmitted packet 204 may be the actual encoded data that is transmitted over the wireless link.

Figure 3:
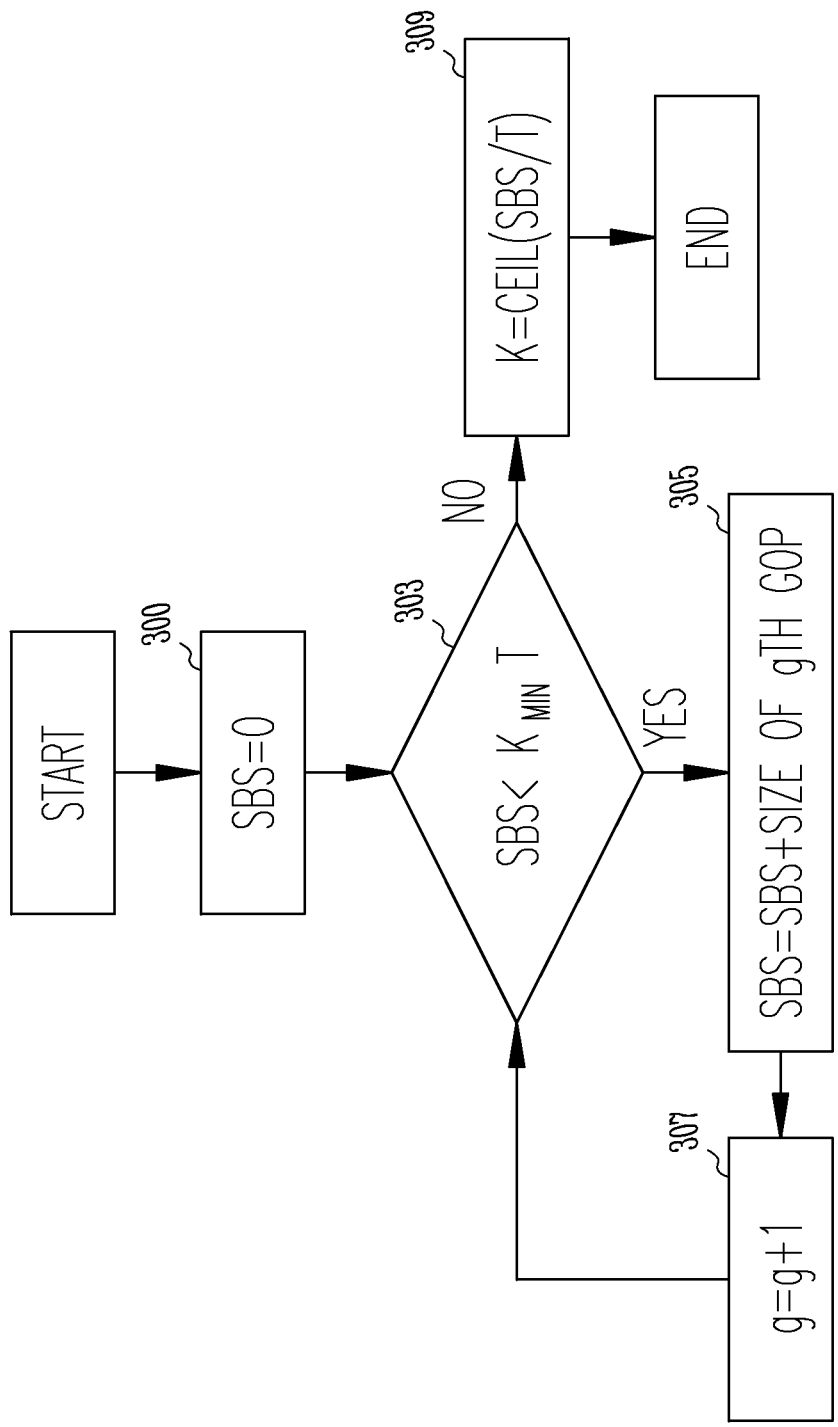
FIG. 3 illustrates a flowchart of an embodiment of a method for determining a source symbol block size in accordance with the encoding method of FIG. 2.

FIG. 3 illustrates a flowchart of an embodiment of a method for determining a source symbol block size in accordance with the encoding method of FIG. 2. In AL-FEC decoding, as described previously, the larger the source symbol block size, the better the video encoder and decoder may perform. However, larger source symbol block sizes may introduce undesirable latency into video transmission. Since the present embodiments may be used during live video streaming, it may be desirable to determine a relatively optimum source symbol block size that reduces latency but still provides relatively good video encoder/decoder performance.

The method initially resets the source symbol block size variable, designated as SBS, to zero 300. This may provide an initial starting point in the determination of the source symbol block size. The source symbol block size may be represented in bytes of data.

The variable SBS is then compared to a minimum size for a source symbol block 303 that is to be sent to an application layer forward error coding layer (AL-FEC) encoder for encoding for transmission. In one embodiment, the minimum size may be determined by $K_{min}*T$ where $K_{min}$ may be the minimum number of symbols (in bytes) that may be present in a symbol block and T may be a size of each source symbol (in bytes).

If the source symbol block size SBS is less than the minimum source symbol block size, the source symbol block size may be increased 305 by adding a "$g^{th}$" group of pictures (GOP) for video encoding to the present source symbol block 305. The GOP may also be described in the art as a group of frames of video.

As used herein, a video frame may be a complete image captured during a known time interval. As may be known by one skilled in the art, a group of frames or GOP may be a group of frames of different frame types. For example, these frame types may include I-frames, P-frames, and B-frames where I-frames may be considered to be the most important.

An I-frame may be an "intra-coded picture" frame that may be a fully specified picture such as a conventional static image. While P-frames and B-frames hold only a portion of the image information so that they need less bandwidth to transmit, an I-frame includes most or all of the image information.

A P-frame, also referred to as "delta-frames" may be a "predictive picture" frame that may hold only the changes in the image from a previous frame. Thus, an encoder may not need to know the unchanging information in an image and can transmit only the changes in order to save bandwidth.

A B-frame may be a "Bi-predictive picture" frame. This frame may comprise even less image information than the P-frame in that the B-frame may comprise only differences between a current frame and both the preceding and subsequent frames.

Referring again to FIG. 3, once the size of the $g^{th}$ GOP is added to the SBS variable 305, "g" is incremented 307 to the next group of pictures and source symbol block size SBS is again compared 303 to the minimum size block size to be sent to the AL-FEC encoder. The steps of 303, 305, and 307 effectively keep adding additional video frame symbols to the source symbol block to be encoded until the source symbol block reaches the minimum size (as determined by the above-describe trade-off) for encoding and transmission over the wireless link.

If the source symbol block size SBS is greater than the minimum source symbol block size $K_{min}T$, a ceiling function may be used to generate an integer K that is the number of symbols in a source symbol block 309. The ceiling function may be represented as ceil(SBS/T). K may then be the number of symbols that are to be sent to the AL-FEC encoder for encoding into AL-FEC source symbol blocks for transmission.

After the source symbol blocks have been encoded and transmitted over the wireless link, the wireless device 100 of FIG. 1 may receive and decode the symbols, as described subsequently with reference to FIG. 4. A typical prior art decoding of received source symbol blocks may drop entire source symbol blocks that cannot be decoded. Thus, all of the data that was in the block is lost, that may result in reduced image quality for the user.

Instead of dropping partial source symbol blocks that cannot be decoded, enhanced video streaming embodiments may use cross-layer coordination between the AL-FEC decoder and the video decoder to exploit the systematic nature of the AL-FEC (i.e., includes the unmodified input data in the output data). In these embodiments, the symbols in a received source symbol block are decoded a group of symbols at a time to determine if any of the video frames having the most information (e.g., I-Frames) have been recovered. These frames may then be sent to the video decoder for decoding and recovery so that at least a portion of the transmitted information, that normally would be lost, can be recovered.

Present embodiments refer to partial source symbol blocks. Partial source symbol blocks may comprise fewer undamaged source symbols than the source symbol block that was originally transmitted. For example, a partial source symbol block might include the same quantity of the originally encoded source symbols but one or more of those source symbols have been received in a corrupted state. A partial source symbol block might also include a received source symbol block that is missing one or more of the originally transmitted source symbols.

Figure 4:
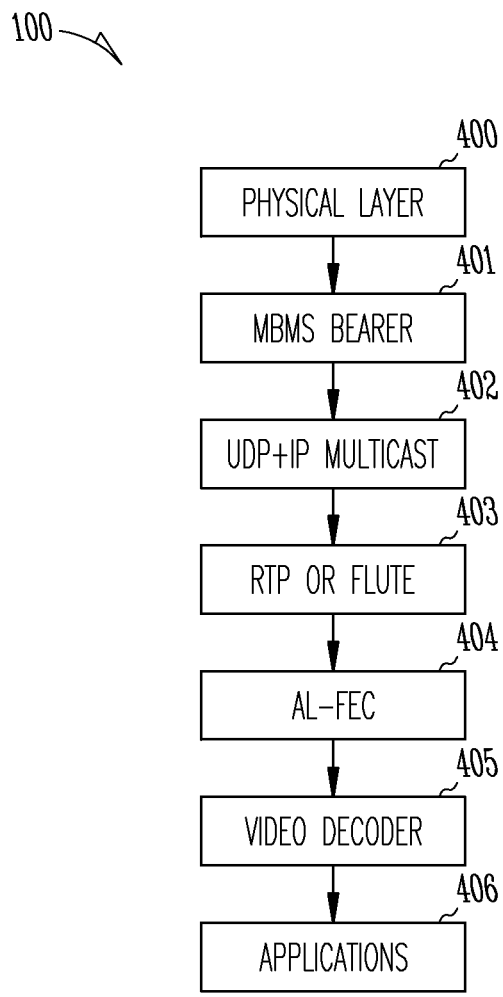
FIG. 4 illustrates a block diagram of an embodiment of different layers of a wireless device in accordance with FIGS. 1 and 2.

FIG. 4 illustrates a block diagram of one embodiment of different layers of a wireless device 100 in accordance with FIGS. 1 and 2. In an embodiment, this block diagram describes an MBMS streaming framework protocol stack. The block diagram of FIG. 4 will be described in terms of a received signal with AL-FEC encoded symbols, such as the transmitted packets generated in FIG. 2. However, the block diagram may also be used in a reverse order of that described in order to transmit signals back to an access point.

A physical layer 400 may include the various circuits, connections, and software used to transmit and receive data over a wireless link. For example, the physical layer might include radio transmitters and receivers.

A Multimedia Broadcast Multicast Service (MBMS) bearer layer 401 may be coupled to, and receive AL-FEC encoded symbols from, the physical layer. The MBMS bearer layer 401 may be responsible for decoding a received signal from the physical layer 400.

A user datagram protocol (UDP)+Internet protocol (IP) multicast layer 402 receives the stream from the MBMS bearer layer 401. The UDP+IP multicast layer 402, like the MBMS bearer layer 401, may be part of a transport protocol. This layer 402 may provide application multiplexing and integrity verification (i.e., via checksum) of the header and payload of the received symbols for subsequent layers. The MBMS bearer layer 401 may reuse most a legacy universal mobile telecommunications system (UMTS) protocol stack in the packet switched domain with only minor modifications to support MBMS.

A real-time transport protocol (RTP) or FLUTE layer 403 receives the stream from the UDP+IP multicast layer 402. The RTP or FLUTE layer 403 may provide synchronization of multiple streams as well as monitor quality of service (QoS) of the streams. The resulting UDP streams may be mapped to MBMS IP multicast bearers in this layer.

An AL-FEC layer 404 receives the stream from the RTP or FLUTE layer 403 for decoding. Using a forward error correction protocol that was used to encode the transmitted symbols, the AL-FEC layer 404 may decode the symbols of a received source symbol block and attempt error correction of the video data.

An AL-FEC layer of a typical prior art wireless device may work independently of a video decoder layer. In such a device, the AL-FEC layer would discard entire source symbol blocks in which some of the symbols are corrupted or lost.

Unlike the prior art decoding, the AL-FEC layer 404 of FIG. 4 may utilize cross-layer coordination with the subsequent video decoder layer 405. If the AL-FEC layer 404 is unable to decode all of a source symbol block or if symbols are lost or corrupted in the source symbol block, the AL-FEC layer 404 still decodes and corrects the portions of the source symbol block into video frames that are able to be decoded and corrected and transmits these recovered video frames to the video decoder layer 405. In an embodiment, only the more important recovered frames (e.g., I-frames) are passed on to the video decoder layer 405.

The video decoder layer 405 may then decode the received video frames into a format used by subsequent video applications 406. The video applications 406 may then display the video frames on a display of the wireless device 100.

In an embodiment, the various layers 400-406 of the wireless device 100 may be implemented in one or more hardware circuits. In an embodiment, the various layers 400-406 may be implemented in firmware that may be stored in memory and that may be executed by control circuitry (e.g., microprocessor, microcontroller).

Figure 5:
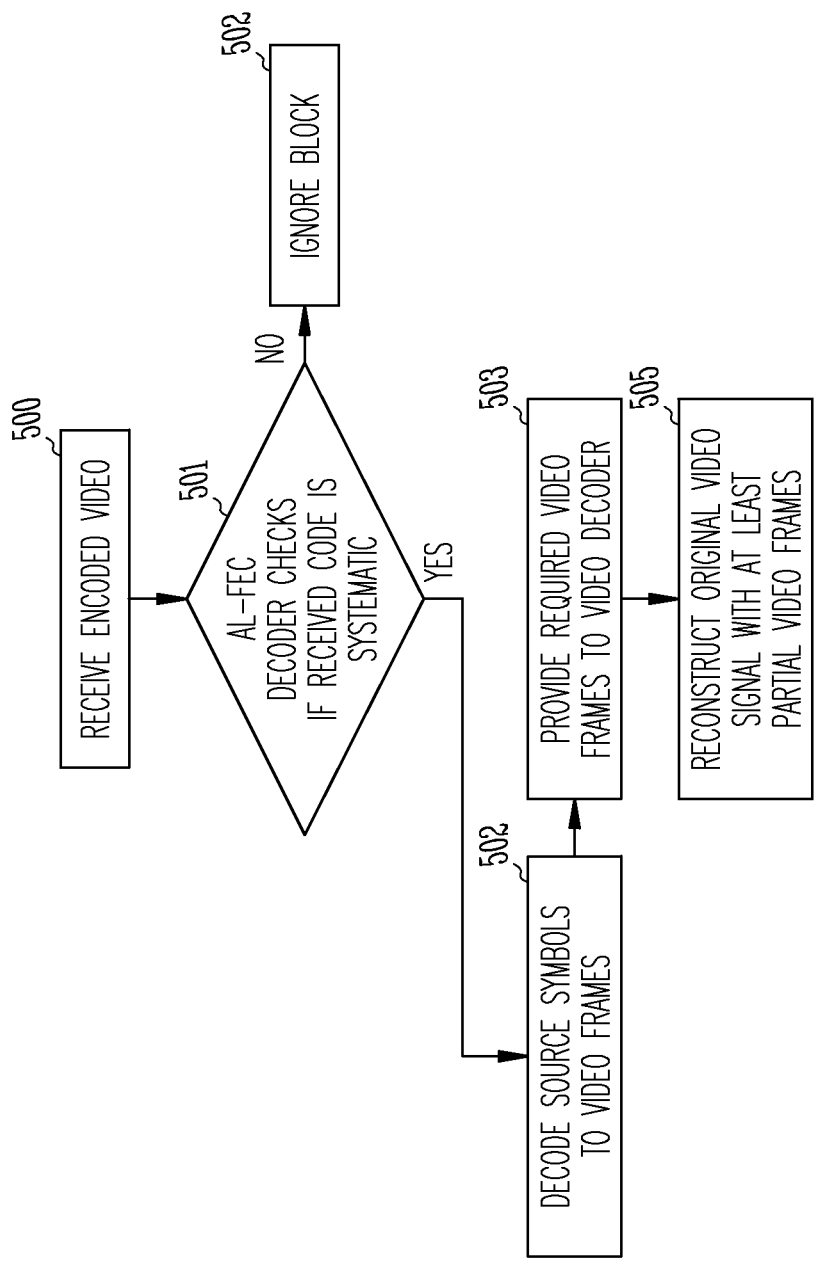
FIG. 5 illustrates a flowchart of an embodiment of a method for decoding a received video stream in accordance with the wireless device of FIG. 4.

FIG. 5 illustrates a flowchart of one embodiment of a method for decoding a received, encoded video stream, that is part of a partial source symbol block, in accordance with the wireless device 100 of FIG. 4. The encoded video stream is received 500 from the wireless link and comprises a plurality of source symbols that may represent an original video signal.

After going through the various layers of the mobile device, as described previously with reference to FIG. 4, the encoded symbol source symbol blocks are input to the AL-FEC decoder layer 404. The AL-FEC decoder layer 404 checks if the received symbol source symbol blocks are systematic 501.

If the received symbol source symbol blocks are non-systematic, the received symbol source symbol block is ignored 502. As described previously, non-systematic symbols do not include the unmodified input in the output symbol. The unmodified input may be used by the illustrated embodiment so that systematic symbols may be more desirable than non-systematic. The AL-FEC decoder of FIG. 4 may use the systematic nature of AL-FEC encoding.

If the received symbol source symbol blocks are systematic, the source symbols in the source symbol blocks may be decoded by the AL-FEC layer 404 according to the FEC code used to encode the symbols. The symbols may be decoded to video frames 502 even if the source symbol block comprises corrupted or missing source symbols. In other words, the AL-FEC layer 404 may decode even partial source symbol blocks to recovered video frames. These partial blocks may comprise only the most important recovered frames (i.e., I-frames).

The recovered, decoded video frames may be provided to the video decoder 503. The video decoder may then use the video frames to attempt to reconstruct the original video signal 505. The video decoder may even reconstruct at least a partial video signal if only a partial source symbol block is received.

Figure 6:
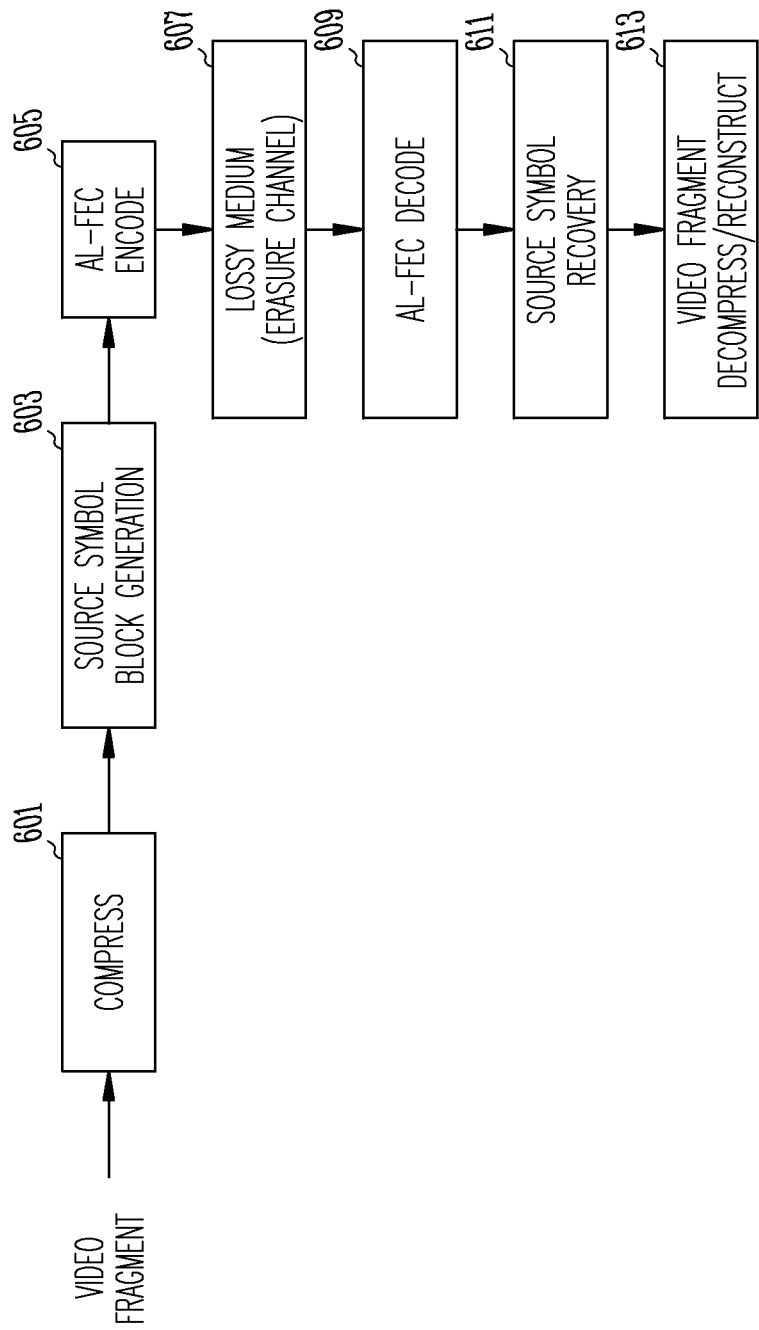
FIG. 6 illustrates a functional block diagram of a system having enhanced video decoding with AL-FEC.

FIG. 6 illustrates a functional block diagram of an embodiment a system having enhanced video decoding with AL-FEC. Such a system may operate in the hardware illustrated in FIG. 1.

A video fragment may be input to a video compression block 601 that may generate compressed data. The compressed data may be input to a source symbol block generation block 603 to generate the source symbol blocks from the compressed data.

The source symbol blocks may then be input to an AL-FEC encoder 605 in order to provide AL-FEC to the source symbols. These encoded symbols may then be transmitted over a channel 607. In an embodiment, the channel may be a lossy medium (e.g., wireless channel) that results in potential packet losses referred to as erasures (i.e., hence the terminology of erasure channel).

A receiver may then receive the transmitted symbols. The received symbols may be input to an AL-FEC decoder 609 in order to decode the received symbol blocks. The decoded symbol blocks may then be input to a source symbol recovery block 611 that recovers the source symbols into compressed video data. The compressed video data may then be input to a video fragment decompression/reconstruction block 613 for decompression and reconstruction of the video data.

Although the wireless device 100 of FIG. 4 is illustrated as having several separate functional layers, one or more of the functional layers may be combined and may be implemented by combinations of software-configured elements, such as processing circuitry including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional layers of the wireless device 100 may refer to one or more processes operating on one or more processing elements.

In some embodiments, the wireless device 100 may be part of a portable wireless communication device, such as a personal digital assistant (PDA), a laptop or portable computer with wireless communication capability, a web tablet, a wireless telephone, a smartphone, a wireless headset, a pager, an instant messaging device, a digital camera, an access point, a television, a medical device (e.g., a heart rate monitor, a blood pressure monitor, etc.), or other device that may receive and/or transmit information wirelessly. In some embodiments, wireless device may include one or more of a keyboard, a display, a non-volatile memory port, multiple antennas, a graphics processor, an application processor, speakers, and other mobile device elements. The display may be an LCD, LED, or organic light emitting diode (OLED) screen, including a touch screen.

Embodiments may be implemented in one or a combination of hardware, firmware, and/or software. Embodiments may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. In some embodiments, a system may include one or more processors and may be configured with instructions stored on a computer-readable storage device.

EXAMPLES

Example 1 is a method for video reconstruction following application layer forward error correction (AL-FEC) decoding, the method comprising: receiving a plurality of symbol blocks, wherein at least one received symbol block comprises a partially recovered symbol block, each symbol block comprises AL-FEC encoding of a corresponding source symbol block having a plurality of source symbols; determining when an AL-FEC decoder is unable to successfully decode at least one of the source symbol blocks from the plurality of received symbol blocks; for each unsuccessful symbol block decoding, determining when the plurality of AL-FEC encoded source symbols of the corresponding partially recovered symbol block was generated by a systematic code; and a video decompression engine generating a reconstructed version of the original video signal from the partially recovered received symbol blocks.

In Example 2, the subject matter of Example 1 can optionally include the plurality of source symbols are systematic when the encoded source symbols comprise an unmodified set of source symbols and repair symbols, the method further comprising: ignoring a partially recovered received symbol block when the encoding on the source symbol is non-systematic.

In Example 3, the subject matter of Examples 1-2 can optionally include the plurality of received symbol blocks are received over a lossy packet erasure channel.

In Example 4, the subject matter of Examples 1-3 can optionally include a combination of the source symbol blocks represents a compressed version of an original video signal.

In Example 5, the subject matter of Examples 1-4 can optionally include wherein the version of the original video signal is a partial version of the original video signal.

In Example 6, the subject matter of Examples 1-5 can optionally include wherein the AL-FEC decoder decodes the source symbols according to a forward error correction code used to encode the source symbols.

In Example 7, the subject matter of Examples 1-6 can optionally include wherein providing the partially recovered received symbol blocks to a video decompression engine comprises providing only recovered video frames that are more important that other video frames to the video decompression engine.

In Example 8, the subject matter of Examples 1-7 can optionally include wherein the more important video frames are I-frames.

In Example 9, the subject matter of Examples 1-8 can optionally include further comprising: decoding the plurality of source symbols to recovered video frames when the received partial source symbol block is systematic; and correcting errors in the plurality of source symbols.

Example 10 is a method for video reconstruction following application layer forward error correction (AL-FEC) decoding, the method comprising: receiving a plurality of partially recovered symbol blocks, each received symbol block comprises a partially recovered transmit symbol block following reception over an erasure channel, each transmitted symbol block comprising AL-FEC encoding of the corresponding source symbol block, each source symbol block comprising a plurality of source symbols, a combination of the source symbol blocks representing a compressed version of an original video signal; determining which source symbol blocks comprise unmodified input data; generating recovered video frames from the partially recovered source symbol blocks in response to AL-FEC when the partially recovered source symbol blocks comprise unmodified input data; discarding source symbol blocks not containing unmodified input data; and generating at least a portion of the original video signal with a video decoder in response to the recovered video frames that are I-frames.

In Example 11, the subject matter of claim 10 can optionally include wherein the plurality of source symbol blocks are generated by: parsing a video file to generate a plurality of transport objects; grouping the transport objects into a plurality of source symbol blocks; encoding the source symbol blocks; and generating transmitted packets from the encoded source symbol blocks.

In Example 12, the subject matter of Example 11 can optionally include wherein encoding the source symbol blocks comprises encoding the source symbol blocks with the AL-FEC.

In Example 13, the subject matter of Examples 11-12 can optionally include wherein each source symbol block has a size that is greater than KminT where Kmin is a minimum number of symbols, in bytes, that is present in a source symbol block and T is a size, in bytes, of each source symbol.

Example 14 is a wireless device comprising: a physical layer configured to receive, over a wireless link, a plurality of partially recovered symbol blocks each comprising a partially recovered source symbol block, each symbol block comprising application layer forward error correction (AL-FEC) encoding of a corresponding source symbol block having a plurality of source symbols; an AL-FEC layer coupled to the physical layer and configured to decode and correct the source symbol blocks, the AL-FEC layer configured to determine when the AL-FEC layer is unable to successfully decode at least one of the source symbol blocks from the plurality of received symbol blocks and, for each unsuccessful symbol block decoding, determine when the AL-FEC encoded source symbols are systematic; and a video decoder layer coupled to the AL-FEC layer and configured to generate a reconstructed version of the original video signal from the received partially recovered symbol blocks.

In Example 15, the subject matter of Example 14 can optionally include wherein the AL-FEC layer uses an AL-FEC scheme to decode and correct the plurality of partially recovered source symbol blocks that was used to encode the plurality of partial source symbol blocks.

In Example 16, the subject matter of Examples 11-15 can optionally include wherein the AL-FEC layer passes only I-frames to the video decoder layer.

Example 17 is a non-transitory computer-readable storage medium that stores instructions for execution by processing circuitry of a wireless device to perform application layer forward error correction (AL-FEC) video decoding, the operations to perform the decoding: receive partially recovered symbol blocks, each symbol block comprising AL-FEC encoding of a corresponding source symbol block having a plurality of source symbols; determine when an AL-FEC decoder is unable to successfully decode at least one of the source symbol blocks from the received symbol blocks; determine when the AL-FEC encoded source symbols were generated by a systematic code; and generate a version of an original video from the partially recovered symbol blocks in response to video decompression.

In Example 18, the subject matter of Example 17 can optionally include wherein the operations to perform the decoding further: decode systematic source symbols from the partially recovered symbol blocks with an AL-FEC scheme used to encode the corresponding source symbol block.

In Example 19, the subject matter of Examples 17-18 can optionally include wherein the operations to perform the decoding further: discard non-systematic source symbols without decoding.

In Example 20, the subject matter of Examples 17-19 can optionally include wherein the operations to perform the decoding further comprise: generate the version of the original video only from recovered video frames that are more important than other recovered video frames.

Example 21 is a method for video reconstruction following application layer forward error correction (AL-FEC) decoding, the method comprising: receiving a plurality of symbol blocks, wherein at least one received symbol block comprises a partially recovered symbol block, each symbol block comprises AL-FEC encoding of a corresponding source symbol block having a plurality of source symbols; determining when an AL-FEC decoder is unable to successfully decode at least one of the source symbol blocks from the plurality of received symbol blocks; determining when the plurality of AL-FEC encoded source symbols of the corresponding partially recovered symbol block was generated by a systematic code; and generating a reconstructed version of the original video signal from the partially recovered received symbol blocks.

In Example 22, the subject matter of Example 21 can optionally include and further comprising not decoding non-systematic source symbols.

Example 25 is a wireless device comprising: means for receiving, over a wireless link, a plurality of partially recovered symbol blocks each comprising a partially recovered source symbol block, each symbol block comprising application layer forward error correction (AL-FEC) encoding of a corresponding source symbol block having a plurality of source symbols; means for decoding and correcting the source symbol blocks coupled to the means for receiving, the means for decoding and correcting configured to determine when an AL-FEC layer is unable to successfully decode at least one of the source symbol blocks from the plurality of received symbol blocks and, for each unsuccessful symbol block decoding, determine when the AL-FEC encoded source symbols are systematic; and means for generating, coupled to the means for decoding and correcting, a reconstructed version of the original video signal from the received partially recovered symbol blocks.

In Example 26, the subject matter of Example 25 can optionally include wherein the means for decoding and correcting uses an AL-FEC scheme to decode and correct the plurality of partially recovered source symbol blocks that was used to encode the plurality of partial source symbol blocks.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A method for video reconstruction following application layer forward error correction (AL-FEC) decoding, the method comprising:
   receiving a plurality of symbol blocks, wherein at least one received symbol block comprises a partially recovered symbol block, each partially recovered symbol block comprises AL-FEC encoding of a corresponding source symbol block having a plurality of source symbols;
   determining when an AL-FEC decoder is unable to successfully decode at least one of the source symbol blocks from the plurality of received symbol blocks;
   for each unsuccessful decoding of a symbol block, determining when the plurality of AL-FEC encoded source symbols of the corresponding partially recovered symbol block was generated by a systematic code that includes unmodified input data;
   generating, by a video decompression engine, a reconstructed version of the original video signal from the partially recovered received symbol blocks;
   wherein the plurality of symbol blocks are created by a video source, prior to the receiving of the plurality of symbol blocks at a wireless device, the creating comprising: setting a symbol block size variable (SBS) to zero; comparing the SBS to a minimum size for a source symbol block, the minimum size corresponding to the product of the minimum number of symbols and the size of each source symbol; increasing the SBS if the SBS is less than the minimum size by adding an index indicating a group of pictures (GOP), for video encoding, and incrementing said index; and repeating said comparing and adding until the SBS reaches the minimum size.

2. The method of claim 1 wherein the plurality of received symbol blocks are received over a lossy packet erasure channel.

3. The method of claim 1 wherein a combination of the source symbol blocks represents a compressed version of an original video signal.

4. The method of claim 3 wherein the version of the original video signal is a partial version of the original video signal.

5. The method of claim 1 wherein the AL-FEC decoder decodes the source symbols according to a forward error correction code used to encode the source symbols.

6. The method of claim 1 and further comprising:
   decoding the plurality of source symbols to recovered video frames when the received partial source symbol block is systematic; and
   correcting errors in the plurality of source symbols.

7. The method of claim 1 wherein the plurality of source symbols are systematic when the encoded source symbols comprise an unmodified set of source symbols and repair symbols, the method further comprising:
   ignoring a partially recovered received symbol block when the encoding on the source symbol is non-systematic.

8. The method of claim 1 wherein providing the partially recovered received symbol blocks to a video decompression engine comprises providing only recovered video frames that are more important that other video frames to the video decompression engine.

9. The method of claim 8 wherein the more important video frames are I-frames.

10. A wireless device comprising:
    a physical layer configured to receive, over a wireless link, a plurality of partially recovered symbol blocks, each received partially recovered symbol block comprising application layer forward error correction (AL-FEC) encoding of a corresponding source symbol block having a plurality of source symbols;
    an AL-FEC layer coupled to the physical layer and configured to decode and correct the partially recovered source symbol blocks, the AL-FEC layer configured to determine when the AL-FEC layer is unable to successfully decode at least one of the partially recovered source symbol blocks from the plurality of received symbol blocks and, for each unsuccessful source symbol block decoding, determine when the AL-FEC encoded source symbols are systematic; and
    a video decoder layer coupled to the AL-FEC layer and configured to generate a reconstructed version of the original video signal from the received partially recovered symbol blocks;
    wherein the plurality of symbol blocks are created by a video source, prior to the receiving of the plurality of symbol blocks at a wireless device, the creating comprising: setting a symbol block size variable (SBS) to zero; comparing the SBS to a minimum size for a source symbol block, the minimum size corresponding to the product of the minimum number of symbols and the size of each source symbol; increasing the SBS if the SBS is less than the minimum size by adding an index indicating a group of pictures (GOP), for video encoding, and incrementing said index; and repeating said comparing and adding until the SBS reaches the minimum size.

11. The wireless device of claim 10 wherein the AL-FEC layer uses an AL-FEC scheme to decode and correct the plurality of partially recovered source symbol blocks that was used to encode the plurality of partial source symbol blocks.

12. The wireless device of claim 10 wherein the AL-FEC layer passes only I-frames to the video decoder layer.

13. A non-transitory computer-readable storage medium that stores instructions for execution by processing circuitry of a wireless device to perform application layer forward error correction (AL-FEC) video decoding, the operations to perform the decoding:
    receive a plurality of symbol blocks, wherein at least one received symbol block comprises a partially recovered symbol block, each partially recovered symbol block comprising AL-FEC encoding of a corresponding source symbol block having a plurality of source symbols;
    determine when an AL-FEC decoder is unable to successfully decode at least one of the source symbol blocks from the received symbol blocks;
    determine when the plurality of AL-FEC encoded source symbol blocks of the corresponding partially recovered symbol block were generated by a systematic code; and
    generate a reconstructed version of an original video signal from the partially recovered symbol blocks;
    wherein the plurality of symbol blocks are created by a video source, prior to the receiving of the plurality of symbol blocks at a wireless device, the creating comprising: setting a symbol block size variable (SBS) to zero; comparing the SBS to a minimum size for a source symbol block, the minimum size corresponding to the product of the minimum number of symbols and the size of each source symbol; increasing the SBS if the SBS is less than the minimum size by adding an index indicating a group of pictures (GOP), for video encoding, and incrementing said index; and repeating said comparing and adding until the SBS reaches the minimum size.

14. The non-transitory computer-readable storage medium of claim 13 wherein the operations to perform the decoding further:
  decode systematic source symbols from the partially recovered symbol blocks with an AL-FEC scheme used to encode the corresponding source symbol block.

15. The non-transitory computer-readable storage medium of claim 13 wherein the operations to perform the decoding further:
  discard non-systematic source symbols without decoding.

16. The non-transitory computer-readable storage medium of claim 13 wherein the plurality of received symbol blocks are received over a lossy packet erasure channel.

17. The non-transitory computer-readable storage medium of claim 13 wherein a combination of the source symbol blocks represents a compressed version of an original video signal.

18. The non-transitory computer-readable storage medium of claim 17 wherein the version of the original video signal is a partial version of the original video signal.

19. The non-transitory computer-readable storage medium of claim 13 wherein the AL-FEC decoder decodes the source symbols according to a forward error correction code used to encode the source symbols.

20. The non-transitory computer-readable storage medium of claim 13 wherein the operations to perform the decoding further:
  decode the plurality of source symbols to recovered video frames when the received partial source symbol block is systematic; and
  correct errors in the plurality of source symbols.

* * * * *